United States Patent
Schaff

(10) Patent No.: US 9,453,893 B2
(45) Date of Patent: Sep. 27, 2016

(54) SPIN DETECTOR ARRANGEMENT FOR MEASURING THE VECTOR COMPONENT OF A SPIN VECTOR PREDOMINATING IN A PARTICLE BEAM

(75) Inventor: Oliver Schaff, Berlin (DE)

(73) Assignee: SPECS Surface Nano Analysis GmbH, Berlin (DE)

( * ) Notice: Subject to any disclaimer, the term of this patent is extended or adjusted under 35 U.S.C. 154(b) by 700 days.

(21) Appl. No.: 13/988,119

(22) PCT Filed: Nov. 16, 2011

(86) PCT No.: PCT/EP2011/070226
§ 371 (c)(1),
(2), (4) Date: Jul. 15, 2013

(87) PCT Pub. No.: WO2012/066024
PCT Pub. Date: May 24, 2012

(65) Prior Publication Data
US 2013/0285661 A1    Oct. 31, 2013

(30) Foreign Application Priority Data
Nov. 17, 2010    (DE) .................. 10 2010 052 088

(51) Int. Cl.
*G01V 3/00*    (2006.01)
*G01R 33/32*    (2006.01)
*G01R 33/12*    (2006.01)

(52) U.S. Cl.
CPC ........... *G01R 33/32* (2013.01); *G01R 33/1284* (2013.01)

(58) Field of Classification Search
USPC ....................................... 324/316
See application file for complete search history.

(56) References Cited

U.S. PATENT DOCUMENTS 3,287,558 A * 11/1966 Bly .................. G21K 1/093
                                              250/305
4,153,844 A *  5/1979 Kirschner ............. G01T 1/32
                                              250/492.1
(Continued)

FOREIGN PATENT DOCUMENTS

DE          19842476 C1    3/2000
DE      102005045622 A1    4/2007
(Continued)

OTHER PUBLICATIONS

Hugo et al., "Topical Review; Spin and angle resolved photoemission on non-magnetic low-dimensional systems", Journal of Physics: Condensed Matter, Institute of Physics Publishing, Bristol, GB, vol. 21, No. 40, Oct. 7, 2009, p. 403001.

(Continued)

*Primary Examiner* — Rodney Fuller
(74) *Attorney, Agent, or Firm* — Rothwell, Figg, Ernst & Manbeck, P.C

(57) ABSTRACT

The invention relates to a spin detector arrangement for detecting vector components of a predominating spin vector in a particle beam (T) having a predominating spin orientation of the particles. The spin detector arrangement comprises: a spin rotator (1) having a switchable coil (5), wherein the switchable coil (5) comprises an axial direction and is aligned such that the particle beam (T) passes through the switchable coil (5) along the axial direction; a deflection device (7) connected downstream of the spin rotator (1) and deflecting the path of the particle beam (T) electrostatically by a deflection angle; a spin detector (9) connected downstream of the deflection device (7), allowing the deflection of the vector component of the spin vector predominating in the particle beam (T) perpendicular to the direction of motion of the particle beam (T); and a switching unit (15) connected to the switchable coil (5), allowing switching of the excitation state of the coil (5).

12 Claims, 3 Drawing Sheets

(56) References Cited

U.S. PATENT DOCUMENTS

| | | | |
|---|---|---|---|
| 4,455,486 A * | 6/1984 | Rau | H01J 37/266 |
| | | | 250/306 |
| 4,760,254 A | 7/1988 | Pierce et al. | |
| 5,166,522 A | 11/1992 | Koike et al. | |
| 8,022,364 B2 * | 9/2011 | Kohashi | B82Y 25/00 |
| | | | 250/251 |
| 2008/0217533 A1 * | 9/2008 | Kohashi | G01N 23/2251 |
| | | | 250/310 |
| 2010/0155598 A1 | 6/2010 | Kohashi | |
| 2013/0126727 A1 * | 5/2013 | Jozwiak | H01J 49/446 |
| | | | 250/305 |

FOREIGN PATENT DOCUMENTS

| | | |
|---|---|---|
| JP | 61-283890 A | 12/1986 |
| JP | 61-284690 A | 12/1986 |
| JP | S61283890 A | 12/1986 |
| JP | 04-206427 A | 7/1992 |
| JP | H08240697 A | 9/1996 |
| JP | 11-111209 A | 4/1999 |
| JP | 03-344320 A | 3/2003 |
| JP | 2005 093106 A | 4/2005 |
| JP | 05-93106 A | 7/2005 |
| JP | 08-251525 A | 10/2008 |
| JP | 2008 251525 A | 10/2008 |
| JP | 10-003450 A | 7/2010 |

OTHER PUBLICATIONS

Notice of Reasons for Rejection issued in Patent Application No. 2013-539239 issued Oct. 27, 2015 (English Translation (3 pgs).

* cited by examiner

9,453,893 B2

SPIN DETECTOR ARRANGEMENT FOR MEASURING THE VECTOR COMPONENT OF A SPIN VECTOR PREDOMINATING IN A PARTICLE BEAM

CROSS REFERENCE TO RELATED APPLICATION

This application is a 35 U.S.C. 371 National Phase Entry Application from PCT/EP2011/070226, filed Nov. 16, 2011, which claims the benefit of German Patent Application No. 10 2010 052 088.8 filed on Nov. 17, 2010, the disclosure of which is incorporated herein in its entirety by reference.

The present invention relates to a spin detector arrangement for detecting vector components of a predominating spin vector in a particle beam having a predominating spin orientation of the particles. Furthermore, the invention relates to a method for detecting all vector components of a predominating spin vector in a particle beam having a predominating spin orientation of the particles.

Spin detector arrangements for detecting vector components of a predominating spin vector are known, for example, from DE 10 2005 045 622 A1, DE 26 46 394 A1, DE 198 42 476 C1, EP 0 490 170 A2, U.S. Pat. No. 4,760,254, US 2010/0155598 A1 and JP 61-283890.

The citations DE 10 2005 045 622 A1, DE 198 42 476 C1 and DE 26 46 394 A1 describe methods and arrangements for detecting components of the spin polarization vector of an electron beam, but without the detection of all three components.

EP 0 490 170 A2 describes a spin detector arrangement using a ferromagnetic target having a specific polarization orientation. The polarization vector of an electron beam to be measured is rotated by means of a rotator at a constant angular velocity. With the help of a login amplifier, an alternating current [A/C] signal is detected at the target, with a saw-tooth shaped current signal supplied to the rotator being used as reference. The angle between the polarization vector of the electron beam hitting the target and the magnetization vector of the target is determined from the phase difference between the saw-toothed reference signal and the detected A/C signal. When using this method to determine all three components of the polarization vector, a detector with four targets is used.

U.S. Pat. No. 4,760,254 describes a device and a method for measuring the spin polarization vector of an electron beam, which can measure all three components of the spin polarization vector. To that end, the device has a spherical condenser having an opening in the line of sight of the incoming electron beam. Depending on whether or not the condenser is charged, the electron beam is supplied to a first or a second target. Whereas the one target is used to measure the x-component and the y-component, the other target is used to measure the y-component and the z-component.

JP 61-283890 describes a device for measuring all three components of the spin polarization vector of an electron beam. To that end, the electron beam successively passes through two targets, with a spherical deflector deflecting the electron beam between the first and the second target.

Therefore, the prior art uses a plurality of targets for measuring all three components of the spin polarization vector.

US 2010/0155598 A1 also describes an electron spin detector for determining all three components of a spin polarization vector. The detection is performed using a magnetic film that allows the detection of a spin in a specific direction. To determine all three components of the spin polarization vector, the device has two spin rotators that can orientate any component of the spin polarization vector into the detectable direction.

One object to be attained by the present invention is to provide an advantageous spin detector arrangement for detecting all vector components of a predominating spin vector in a particle beam. Another object of the present invention is to provide an alternate method for detecting all vector components of a predominating spin vector in a particle beam.

The first object is attained with a spin detector arrangement in accordance with Claim 1; the second object is attained with a method in accordance with Claim 9. The dependent claims contain advantageous embodiments of the invention.

A spin detector arrangement in accordance with the invention for detecting vector components of a predominating spin vector in a particle beam having a predominating spin orientation of the particles comprises a spin rotator; a deflection device connected downstream of the spin rotator, which deflects the path of the particle beam, for example electrostatically by a deflection angle; and a spin detector connected downstream of the electrostatic deflection device, which allows the detection of the vector components of a spin vector perpendicularly to the direction of motion of the particle beam. The spin rotator comprises at least one switchable coil having an axial direction, which is aligned in such a fashion that the particle beam passes through the switchable coil along the axial direction. A switching unit connected to the switchable coil facilitates the switching of the excitation state of the coil and thus the magnetic field generated by the coil. Furthermore, the spin rotator can optionally comprise an electrostatic or magnetic lens.

By scattering the particles on a target, the detector, which, for example, can be a Mott detector and in particular a micro Mott detector, can detect the vector components of the predominating spin vector in the particle beam which are perpendicular to the direction of motion of the particle beam when they hit the target. With the switchable coil, the spatial orientation of the predominating spin vector in the particle beam can be rotated about the "old" direction of motion of the particle beam before it passes through the deflection device. This rotation about the "old" direction of motion determines which vector components of the predominating spin vector in the particle beam are positioned on a plane perpendicular to the "new" direction of motion, i.e., the direction of motion when hitting the target of the detector, after passing through the deflection device. Therefore, switching the coil can effect a change of those vector components that are in the plane perpendicular to the "new" direction of motion. Depending on how the coil is switched, the detector will therefore detect different vector components of the predominating spin vector in the particle beam. Overall, all vector components of the predominating spin vector can be detected in this way.

Compared to the prior art spin detectors mentioned earlier, the present invention has the advantage of requiring only one target.

The spin detector arrangement in accordance with the invention can be used to execute the method in accordance with the invention for detecting all vector components of a predominating spin vector in a particle beam. With this method, the detector successively measures two respective vector components of the predominating spin vector, with the coil of the spin rotator being placed in a first state of excitation by means of the switching unit in the first measurement, and in a second state of excitation in the other measurement. The first and the second state of excitation of the coil can be different with respect to current strength and/or the sign of a current that flows through the coil.

In a first example, a current of a specific strength can flow through the coil in the first excitation state; in the second excitation state, the current has the same strength as in the first excitation state, but the sign is reversed compared to the first excitation state. This embodiment has the advantage that the switching does not affect the particle-optical properties of the spin rotator because the lens effect of the coil is influenced only by the strength of the current flowing through the coil, but not by the sign of the current.

In a second example of the method, a current of a specific strength greater than Zero can flow through the coil in a first excitation state, and a current of a current strength Zero can flow through the coil in a second excitation state. In other words, in this example, no current flows through the coil in the second excitation state. The switching unit can be kept simple because it is only needed to switch the current flowing through the coil on or off.

The strength of the current flowing through the coil determines the magnetic flux density of the magnetic field generated in the coil, which in turn determines the velocity at which the spin vector is rotated about the "old" direction of motion. At a given coil length, the strength of the current flowing through the coil therefore determines the angle at which the predominant spin vector is rotated about the "old" direction of motion. By setting the current strength and the sign of the current flowing through the switchable coil of the spin rotator, the strength and the orientation of the magnetic field and therefore the angle at which the spin vector is rotated about the "old" direction of motion, as well as the rotation direction, can be adjusted via the excitation state of the coil.

If a yoke encloses the switchable coil of the spin rotator, stronger magnetic fields can be generated at the same current strength. A specific rotation of the predominating spin vector can then be obtained with a coil that is shorter compared to a coil without a yoke. Alternately, there is the option of causing a specific rotation of the predominating spin vector at the same coil length as with a coil without yoke with a lower current strength. Furthermore, the yoke reduces scatter fields so that an interference of the imaging properties of the spin rotator can be minimized with the switching of the magnetic field.

Further characteristics, properties and advantages of the present invention follow from the description of the embodiments below, with reference to the attached figures.

Figure 1:
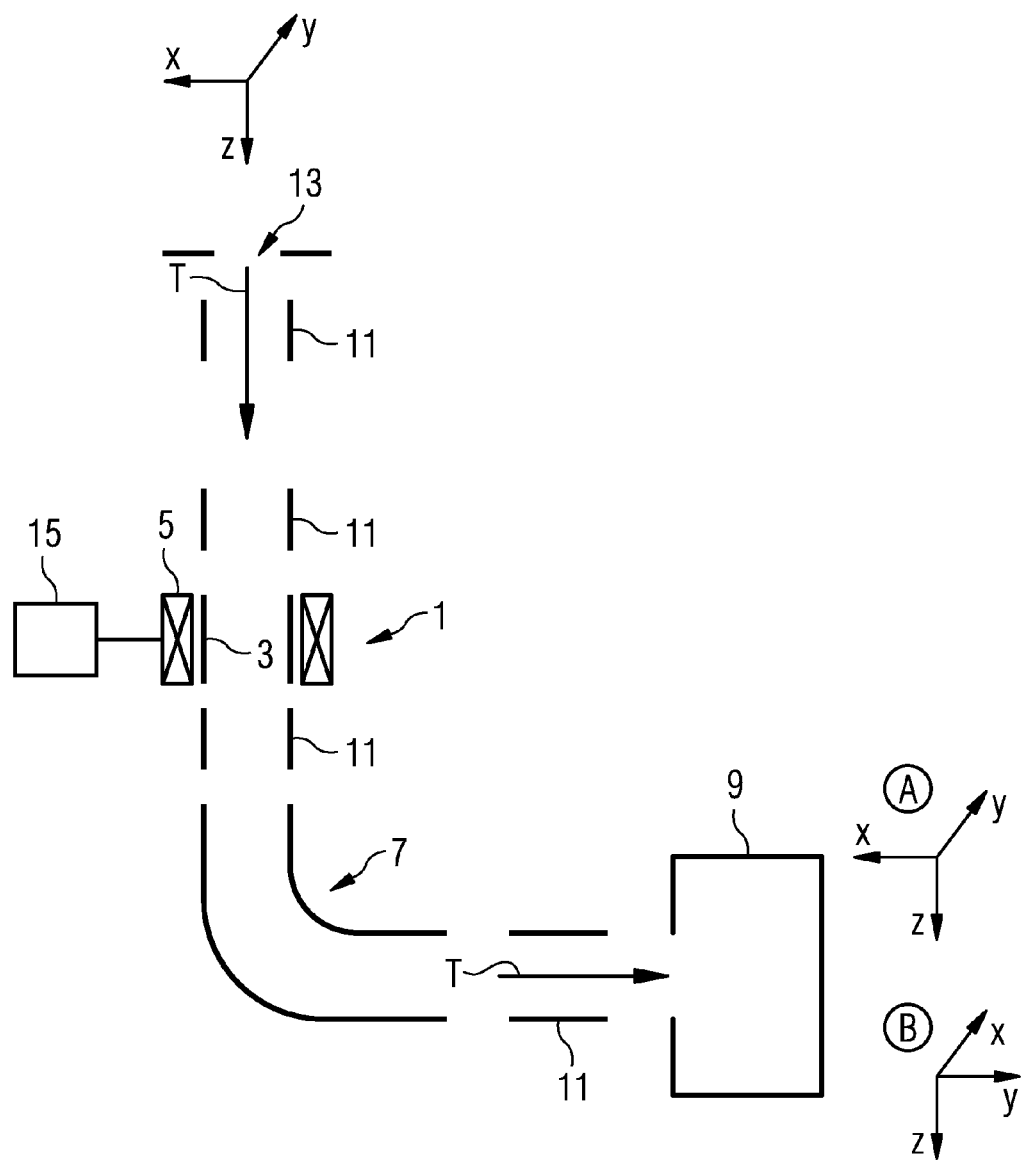
FIG. 1 shows the schematic representation of an embodiment of a spin detector arrangement in accordance with the invention.

An embodiment of a spin detector arrangement in accordance with the invention is described in the following with reference to FIG. 1. As essential elements, this arrangement comprises a spin rotator 1, which in the shown embodiment comprises an electrostatic lens 3 with a switchable coil 5; a deflection device 7 that is connected downstream of the spin rotator and operated purely electrostatically in the present example; and a spin detector 9 that is connected downstream of the electrostatic deflection device and developed as a micro Mott detector in the present embodiment. Furthermore, the spin detector arrangement in accordance with the invention can comprise additional electrostatic or magnetic elements 11, as in the shown embodiment. For example, these can be additional electrostatic lenses, drift tubes or condensers that can be used to manipulate the path of a particle beam of charged particles passing through the spin detector arrangement. As described, the spin rotator 1 comprises an electrostatic lens in the present example. However, the presence of the electrostatic lens is not a requirement for the operation of the spin rotator. In the simplest case, the spin rotator may comprise only the coil 5, with the magnetic field of said coil causing the spin rotation. If the spin rotator comprises other elements in addition to the coil 5, other electrostatic and/or magnetic elements such as magnetic lenses, drift tubes, etc. may be present instead of the electrostatic lens 3 or in addition to the electrostatic lens 3.

A particle beam T enters through an entrance hole 13 into the spin detector arrangement and successively passes through the spin rotator 1 and the electrostatic deflection element 7 to finally reach the micro Mott detector 9. The particle beam T contains particles with a spin, with the orientation of the spin of the particles in the particle beam having a preferred direction. This preferred direction is represented by a spin vector that is determined by three spin vector components. However, this does not mean that all particles of the particle beam T have a spin that is orientated in the preferred direction. Rather, there is a distribution of the spin orientations of the individual particles, with said distribution having a maximum when the spin orientation corresponds to the preferred direction. The sharpness of the maximum, i.e., its height relative to its width, depends on the degree of polarization in the particle beam, which in turn depends on the process creating the polarization.

In the micro Mott detector, the vector components of the predominating spin vector in the particle beam T which run perpendicular to the direction of motion of the particle beam T can be determined with the help of a planar target on which there occurs a scattering that depends on the polarization direction of the particles in the target plane, and which has a target plane that runs perpendicular to the reference orientation of the particle beam. For example, if the direction in which the particle beam T enters the spin detector arrangement through the entrance hole 13 is defined as Z-direction in FIG. 1 in a coordinate system that is coupled with the spin of the particles of the particle beam, then the perpendicular directions are the X-direction and the Y-direction. In the shown embodiment, the electrostatic deflection element 7 deflects the direction of the particle beam by 90° without changing the orientation of its spin. Therefore, in the present embodiment, its direction of motion runs opposite the X-direction after passing through the deflection element 7, as indicated by the coordinate axes marked with the reference symbol A. Then, the Y-component and the Z-component of the spin vector representing the predominant spin orientation are detected in the micro Mott detector 9 as long as the spin rotator 1 does not rotate the spin of the particles in the particle beam. As long as the spin rotator 1 does not rotate the spin, the preferred direction of the spin in the particle beam—and therefore the orientation of the coordinate system coupled therewith—is not affected.

Figure 2:
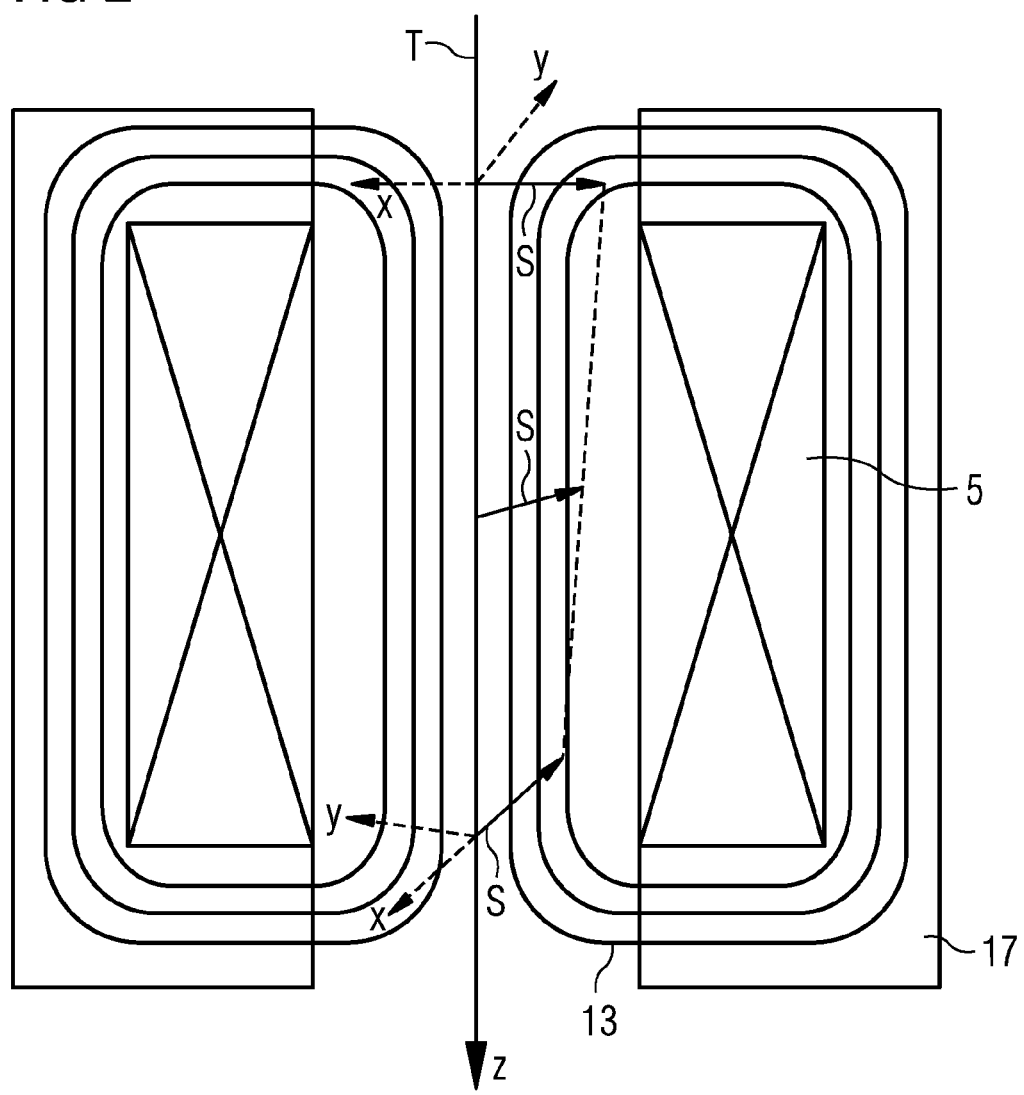
FIG. 2 shows the rotation of the spin in the magnetic field.

In the present embodiment the spin rotator 1 has, in addition to the electrostatic lens 3, also the switchable coil 5 which is orientated relative to the direction of motion of the particle beam T in such a fashion that the particle beam passes through the coil in axial direction, i.e., in the present embodiment, the axial direction of the coil runs in the Z-direction of the coordinate system coupled to the spin vector of the particle beam. To switch the coil 5, the spin detector arrangement has a switching unit 15 that is connected to the coil 5 of the spin rotator 1. If the coil 5 on is switched in the present embodiment, a current flow through the coil 5 generates a magnetic field inside the coil. The coil 5 with the field lines of a magnetic flux density B is shown in FIG. 2. Furthermore, FIG. 2 shows the direction of motion Z of the particle beam T passing through the coil 5, and a spin vector component s that runs perpendicular to the direction of motion Z. In the magnetic field, which has magnetic field lines that run in the interior of coil 5 parallel to the direction of motion Z in of the particle beam in the present embodiment, the spin vector component s is subject to a precession, e.g. a rotation about the direction of motion Z of the particle beam T. The angle about which the spin component s is rotated depends on the strength of the magnetic field as well as the path traveled through the magnetic field. The stronger the magnetic field is with a given path, the faster the spin rotates and the greater is the angle of rotation after passing through the magnetic field.

The magnetic field in the interior of the coil 5 is shown as a homogenous magnetic field in the present embodiment. However, the presence of a homogenous magnetic field in the interior of the coil 5 is not a requirement for the functioning of the spin rotator. The rotation of the spin can be caused not only with homogenous magnetic fields, but also with inhomogeneous magnetic fields. When using inhomogeneous magnetic fields, the coil can also perform particle beam optical functions, for example, as a magnetic lens it can cause a focusing or defocusing of the particle beam.

In the present embodiment, the path that the particle beam T must travel through the magnetic field and the strength of the magnetic field are coordinated in such a way that after passing the magnetic field, the spin vector component s is rotated by 90° about the direction of motion. In the coordinate system that is coupled with the spin vector, this means that the coordinate system is rotated by 90° about the Z-axis. Therefore, if a spin vector has a specific orientation in the coordinate system A, it will have that orientation in the coordinate system B after passing through the spin rotator when the magnetic field turned on. In other words, the spin vector is still represented by the same value of the X-coordinate, the Y-coordinate and the Z-coordinate but with the coordinate system coupled therewith rotated by 90° about the Z-coordinate. Because in the present embodiment, only electrostatic deflections occur after passing through the magnetic field of the spin rotator 1, which do not affect the orientation of the spin vector, the direction of motion of the particle beam T then corresponds to the Y-direction of the coordinate system linked with the spin vector after passing through the electrostatic deflection element 7. Therefore, the X-component and the Z-component are measured in the micro Mott detector 9. The absence of any effect on the orientation of the spin vector simplifies in particular the illustration of the present invention, but it is not necessary for the functioning of the invention. Even if there is a magnetic deflection or other effect on the particle beam which affects the orientation after it passes through the spin rotator 1, the invention can still be executed as long as the spin is not rotated so far about the original direction of motion in the magnetic effect that the rotation caused by the spin rotator 1 is completely compensated again. However, it is advantageous if there is no more magnetic effect, which could rotate the spin about the original direction of motion (Z-direction in FIG. 1), on the particle beam after it passes through the spin rotator 1. On the other hand, a rotation of the spin about the "new" direction of motion of the particle beam after passing through the deflection device 7 (X-direction when the coil is turned off, as shown in the coordinate system A, and Y-direction when the coil is turned on, as shown in the coordinate system B), is not critical because it leaves the spin vector components that are situated on the plane that is perpendicular to the direction of motion in that plane. It is in particular advantageous, however, if the particle beam is influenced only electrostatically on the path to the detector 9 to be able to reliably rule out undesired influences of magnetic fields on the orientation of the spin.

Therefore, all three components of the predominant spin vector in a particle beam T can be determined with the help of the spin detector arrangement shown in the embodiment by first detecting the Y-component and the Z-component of the spin vector in accordance with the embodiment when the coil 5 of the spin rotator 1 is turned off. Then the magnetic field of the coil 5 is turned on by means of the switching unit 15, and the X-component and the Z-component of the spin vector are detected.

In the present embodiment, a yoke 17 encloses the coil 5. This reduces scattering fields that could negatively influence the particle-optical properties of the spin rotator. Furthermore, it leads to an increased density of the magnetic field in the interior of the coil so that a specified value of the magnetic flux density in the interior of the coil can be obtained with a lower strength of the current flowing through the coil 5.

In particular, the particle beam can be an electron beam. But a preferred direction of the spin orientation in particle beams comprised of electrically charged particles, in particular the preferred direction of the spin orientation in ion beams, can also be detected with the aforementioned spin detector arrangement with all three components.

Figure 3:
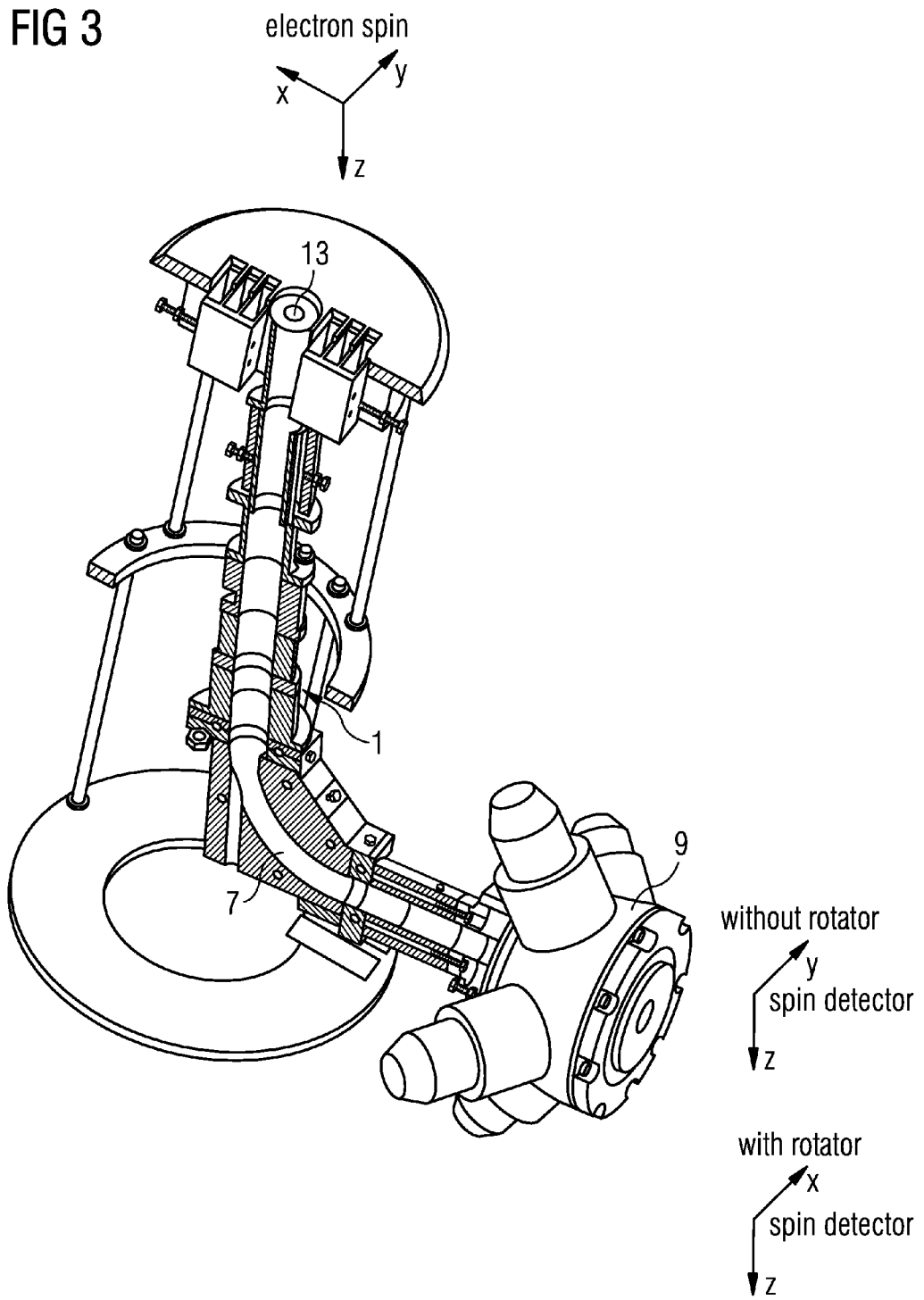
FIG. 3 shows a specific embodiment of a spin detector arrangement in accordance with the invention in a sectional perspective representation.

In the following, a specific embodiment of the spin detector arrangement is described with reference to FIG. 3

The instrument shown in the diagram measures the spin of an electron, typically at the exit of the semi-spherical photoelectron spectrometer. The electron enters the detector through the entrance hole 13 with a spin polarization ("spin") with components in x, y, z direction. The electrostatic lens system, including 90° deflector 7, guides the electron in the micro Mott detector 9. This is where two of the three spin vector components are measured.

The lens element 1 used as "spin rotator lens" is either completely electrostatic ("without rotator"), or an additional defined magnetic field ("with rotator") can be applied. With this additional magnetic field, the electron spin is rotated by an amount of 90° about the z-axis.

If the magnetic field in the spin rotator 1 is turned off ("without rotator"), the micro Mott detector can determine the y- and z-component of the spin.

If the magnetic field in the spin rotator 1 is turned on ("with rotator"), the micro Mott detector can determine the x- and z-component of the spin.

Therefore, all three components of the electron spin can be determined sequentially by turning the spin rotator on and off. Without the spin rotator 1, only y- and z-components can be determined.

The entire spin detector arrangement is arranged in a vacuum chamber. The micro Mott detector has a planar scattering target and four channeltrons. The spin rotator 1 allows a quick switching between the spin vector components that are detected with the micro Mott detector 9. The spin detector arrangement measures the particle spin, in particular an electron spin, from exactly one point in the E(k) space. Therefore, there is no energy shift in the detection of different spin components.

The present invention was explained for illustration purposes using specific embodiments. However, one skilled in the art will know that deviations from said embodiments are possible. For example, in the embodiments, the switching states of the coil 5 were selected so that in one switching state, it generates a magnetic field that causes a rotation of the spin by 90°, and in another switching state, it does not generate a magnetic field. However, alternately it is also possible to select the switching states so that in the one switching state, a magnetic field is generated which causes a rotation of the spin by 45°, and in another switching state, it generates a magnetic field that causes a rotation of the spin by −45°. This embodiment has the advantage that the lens effect that is affected only by the current flowing through the coil, but not by its sign, is the same in both switching states. However, overall, the important criteria in both switching states are only that the spin is rotated about different angles (i.e., approximately 0° in one switching state and 90° in the other switching state, or 45° in one switching state and −45° in the other switching state). It is not even necessary that the difference between the two angles of rotation is 90°. However, a 90° angle of difference has the advantage of the easiest detection of the three components. Likewise, the deflection element 7 does not necessarily need to deflect the particle beam by 90°; a smaller deflection is also sufficient. However, here, a 90° angle also has the advantage of the easiest detection of the three components.

REFERENCE SYMBOL

1 Spin rotator
3 Electrostatic lens
5 Switchable coil
7 Electrostatic deflection element
9 Detector
11 Electrostatic elements
13 Entrance hole
15 Switching unit
17 Yoke
B Field lines of the magnetic flux density

The invention claimed is:

1. Spin detector arrangement for detecting vector components of a predominant spin vector in a particle beam having a predominant spin orientation of the particles, with the spin detector arrangement comprising:
 a spin rotator having a switchable coil, with the switchable coil having an axial direction and being aligned such that the particle beam passes through the switchable coil along the axial direction;
 a deflection device connected downstream of the spin rotator, which deflects the path of the particle beam electrostatically by a deflection angle;
 a spin detector connected downstream of the deflection device, which allows the detection of the perpendicular vector components of the predominant spin vector in the particle beam relative to the direction of motion of the particle beam; and
 a switching unit connected to the switchable coil, which allows the switching of the excitation state of the coil, wherein the spin detector is configured to successively measure two respective vector components of the predominating spin vector and the switching unit is configured to switch the coil of the spin rotator into a first excitation state in the one measurement, and into a second excitation state in the other measurement.

2. Spin detector arrangement in accordance with claim 1, wherein the spin rotator comprises an electrostatic lens that is enclosed by the switchable coil.

3. Spin detector arrangement in accordance with claim 1, wherein the deflection device connected downstream of the spin rotator is a deflection device that causes an electrostatic deflection.

4. Spin detector arrangement in accordance with claim 1, wherein the deflection device connected downstream of the spin rotator is a deflection device that deflects the path of the particle beam electrostatically by 90°.

5. Spin detector arrangement in accordance with claim 1, wherein the current strength and/or the sign of the current flowing through the switchable coil can be adjusted by means of the switching unit.

6. Spin detector arrangement in accordance with claim 1, wherein a yoke encloses the switchable coil of the spin rotator.

7. Spin detector arrangement in accordance with claim 6, wherein the detector is a Mott detector.

8. Spin detector arrangement in accordance with claim 1, wherein the detector is a detector that simultaneously detects two vector components perpendicularly to one another.

9. Method for detecting all vector components of a predominating spin vector in a particle beam using a spin detector arrangement for detecting vector components of a predominant spin vector in a particle beam having a predominant spin orientation of the particles, with the spin detector arrangement comprising:
 a spin rotator having a switchable coil, with the switchable coil having an axial direction and being aligned such that the particle beam passes through the switchable coil along the axial direction;
 a deflection device connected downstream of the spin rotator, which deflects the path of the particle beam electrostatically by a deflection angle;
 a spin detector connected downstream of the deflection device, which allows the detection of the perpendicular vector components of the predominant spin vector in the particle beam relative to the direction of motion of the particle beam; and
 a switching unit connected to the switchable coil, which allows the switching of the excitation state of the coil, wherein the spin detector successively measures two respective vector components of the predominating spin vector, with the coil of the spin rotator being switched by means of the switching unit into a first excitation state in the one measurement, and into a second excitation state in the other measurement.

10. Method in accordance with claim 9, wherein the first and the second excitation state of the coil are different with respect of the current strength and/or the sign of a current flowing through the coil.

11. Method in accordance with claim 10, wherein a current with a specific current strength flows through the coil in the first excitation state, and a current of the same current strength as in the first excitation state, but with a reversed sign compared to the first excitation state, flows through said coil in the second excitation state.

12. Method in accordance with claim 10, wherein in the first excitation state, a current of a specific current strength flows through the coil at an amount greater than Zero, and in the second excitation state, no current flows through said coil.

* * * * *